(12) United States Patent
Kuang et al.

(10) Patent No.: US 7,046,063 B2
(45) Date of Patent: May 16, 2006

(54) INTERFACE CIRCUIT FOR COUPLING BETWEEN LOGIC CIRCUIT DOMAINS

(75) Inventors: Jente B. Kuang, Austin, TX (US); Hung C. Ngo, Austin, TX (US); Kevin J. Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 10/821,047

(22) Filed: Apr. 8, 2004

(65) Prior Publication Data
US 2005/0225355 A1 Oct. 13, 2005

(51) Int. Cl.
*H03K 3/356* (2006.01)
(52) U.S. Cl. .................. 327/201; 327/203; 326/98
(58) Field of Classification Search .................. 326/81, 326/83, 86, 112, 119, 121, 93, 95, 98; 327/201–203
See application file for complete search history.

(56) References Cited

U.S. PATENT DOCUMENTS

| | | | |
|---|---|---|---|
| 5,557,221 A * | 9/1996 | Taguchi et al. ............ 327/53 |
| 6,211,713 B1 * | 4/2001 | Uhlmann .................. 327/211 |
| 6,275,077 B1 * | 8/2001 | Tobin et al. ............... 327/108 |
| 6,424,178 B1 * | 7/2002 | Harrison .................... 326/93 |
| 6,433,584 B1 * | 8/2002 | Hatae ........................ 326/80 |
| 6,862,226 B1 * | 3/2005 | Toyoda et al. ......... 365/189.07 |
| 2003/0231040 A1 * | 12/2003 | Masleid et al. ........... 327/218 |
| 2004/0119505 A1 * | 6/2004 | Ryan ......................... 326/112 |

OTHER PUBLICATIONS

Kimiyoshi Usami et al. "Automated Selective Multi-Threshold Design For Ultra-Low Standby Applications," *IEEE ISLPED*, Aug. 2002, pp. 202-206.

* cited by examiner

*Primary Examiner*—Vibol Tan
(74) *Attorney, Agent, or Firm*—Richard F. Frankeny; Winstead Sechrest & Minick P.C.; Casimer K. Salys

(57) ABSTRACT

CMOS circuitry is partitioned into first and second logic circuit domains. The first logic circuit domain may be optionally a cuttable domains (C_Domains) where circuitry has power supply gating to reduce leakage power and non-cuttable domains (NC_Domains) where circuitry does not have power supply gating. Each output that couples signals from one logic circuit domain to another logic circuit is interfaced with a C_driver and a S_keeper which automatically assure that the output state is held when circuitry is power-gated put to reduce leakage power. The S_keeper and C_driver have low leakage circuits that maintain signal states and are not used for high speed operation.

24 Claims, 8 Drawing Sheets

INTERFACE CIRCUIT FOR COUPLING BETWEEN LOGIC CIRCUIT DOMAINS

GOVERNMENT RIGHTS

This invention was made with Government support under NBCH30390004 awarded by DEFENSE ADVANCED RESEARCH PROJECT AGENCY. The Government has certain rights in this invention.

TECHNICAL FIELD

The present invention relates in general to complementary metal oxide semiconductor (CMOS) circuits, and in particular, to circuit methodologies for reducing leakage in sub-100 nm technologies.

BACKGROUND INFORMATION

Oxide tunneling current in metal oxide silicon (MOS) field effect transistors (FET) is a non-negligible component of power consumption as gate oxides get thinner, and may in the future become the dominant leakage mechanism in sub-100 nm CMOS circuits. The gate current is dependent on various conditions and three main static regions of operation may be identified for a MOSFET. The amount of gate-leakage current differs by several orders of magnitude from one region to another. Whether a transistor leaks significantly or not is also affected by its position in relation to other transistors within a CMOS circuit structure, as this affects the voltage stress to which a particular device is subjected.

The three regions of operation are functions of applied bias if one only considers the parameters that affect the magnitude of gate-leakage current in one MOSFET as it operates in relation to other MOSFETs. Assuming that the supply voltage (Vdd) and the threshold voltage (Vt) are fixed, then a MOSFET in a static CMOS logic gate operates in one of the three regions.

The first region is called "strong inversion" and is the region where a MOSFET operates with the absolute value of the gate to source voltage (|VGS|) equal to Vdd. The gate-leakage current density for an N-channel FET (NFET) in strong inversion may be as high as $10^3$ amperes (A)/square centimeter ($cm^2$) for an oxide thickness of 1.5 nanometers (nm) at a Vdd equal to 3 volts (V). For such a thin oxide, a more realistic operational value for Vdd is 1.2 V, in which case the gate-leakage current would more likely be around 20 $A/cm^2$.

The second region is called the "threshold" region where |VGS|=Vt. A MOSFET operating in the threshold region will have a gate-leakage current significantly less than one operating in the strong inversion region, typically 3 to 6 orders of magnitude less depending on Vdd and the oxide thickness.

The third region is called the "OFF" region where |VGS|=0.0 V. For an NFET operating in the OFF region, there is no leakage if the drain voltage (Vd)=0.0 V. However, if Vd is equal to Vdd, then a small gate-leakage current in the reverse direction (drain to gate) may be present due to gate-drain overlap area. Of course, this current depends on transistor geometry and is typically 10 orders of magnitude less than the gate-leakage current in the strong inversion region.

The above three regions represent three distinct conditions or states for the channel of a MOSFET. Whether an "ON" FET operates at strong inversion or at threshold is determined by its position inside a logic circuit structure as well as by the state of other FETs in the circuit structure.

Both NFETs and P-channel FETs (PFETs) in a logic circuit structure operate in one of the three regions described above. However, the main tunneling current in a PFET device in strong inversion is due to hole tunneling from the valence band, and the main tunneling current in an NFET device in strong inversion is due to electron tunneling from the conduction band. Because of this, PFET gate-leakage currents are about 10 times smaller than equivalent sized NFET devices. This fact is important in assessing gate-leakage in a static CMOS circuit.

Another component of leakage current is called sub-threshold leakage current. This current flows from the drain to the source of a FET when the gate is below the threshold voltage. This component of leakage is not a function of gate oxide thickness but is primarily a function of the gate width, the device threshold voltage and the power supply voltage. Sub-threshold leakage may be reduced by reducing gate width, increasing the threshold voltage or reducing the power supply voltage. For a given technology family, it is assumed that the power supply voltage has been reduced to a required level to minimize dynamic switching power. Likewise the gate width is reduced as a result of reducing device sizes. To minimize sub-threshold power below the limit established by these parameters requires some type of power supply voltage management within particular circuits.

As CMOS circuits become smaller, gate-leakage current of the FETs may become a significant factor in power dissipation. Leakage power may ultimately become the limiting factor in determining how small practical FET devices may be manufactured. As FET devices are made smaller, the power supply voltage is correspondingly reduced. However, this may not achieve an adequate reduction in leakage power dissipation. Alternate techniques are being employed to reduce gate-leakage power.

To reduce sub-threshold leakage power supply management techniques may be used wherein the supply voltage is degated and thus reduced to zero for particular devices. This technique is referred to as power-gating and isolates the power supply voltage in groups of circuits at controlled times. Since this may cause a loss of a logic state additional action may be necessary. These circuits are sometimes referred to as being part of a power-gated or "cuttable" domain. Other circuits may be evaluating a logic function and may not be in a power-gated domain. Interfacing circuits from a power-gated domain to circuits in a non-power-gated domain may require methods to ensure logic states are preserved. The logic state of an output from a power-gated domain may become uncertain during the time period of power-gating. While the benefits of power-gating are known, there is no consensus on strategies to preserve logic states of outputs in the power-gated domains. Since power-gated domains may be variably applied, the method of preserving output logic states from circuits in a power-gated domain should be controlled by the power-gating control signals themselves.

There is, therefore, a need for a circuit methodology for designing CMOS circuits that allows the variable use of power-gating to reduce sub-threshold leakage while preserving the output states of outputs interfacing between power-gated domains and non-power-gated domains.

SUMMARY OF THE INVENTION

Circuits may be partitioned into groups wherein the circuits with power-gating are grouped in power-gated (cuttable) domains with control signals and circuitry required to controllably couple the power supply voltages to the selected devices. Output signals from the power-gated domains are isolated with low-leakage logic state "keeper" circuitry that latches and preserves the output logic states when the power-gated domain is switched into the power saving mode. The last stage within a power-gated domain providing an output has an inverting circuit (driver) with an input that is generating some Boolean logic function. Since this driver is part of the power-gated domain, it is referred to as a "cuttable" driver (C_driver), meaning that its power supply voltage may be decoupled in response to control signals. The C_driver has an output that would normally be used to interface with circuitry in a non-power-gated domain. The positive power supply voltage to the C_driver is insolated with a PFET that is gated with a first control signal referred to as Cut_P (gates a PFET). Likewise the negative (ground) power supply voltage is decoupled with an NFET that is gated with a second control signal referred to as Cut_N (gates a NFET). Cut_P and Cut_N are complementary signals. Anytime circuitry in the power-gated domain is set in the power saving mode, Cut_P is set to a logic one and Cut_N is set to a logic zero. The PFET and NFET used to isolate the power supply voltage are not computation devices and may be constructed to trade off speed of operation for low leakage.

The C_driver is coupled in parallel to a low leakage logic state keeper circuit (S_keeper) which is designed to also trade off speed for low leakage characteristics since its main function is to preserve the output's logic state while the C_driver and other circuits in the power-gated domain are set in the low leakage mode. The input to the C_driver is coupled to the input of the S_keeper and the output from the S_keeper is coupled to the output of the C_driver. The S_keeper has a forward circuit path and a feedback circuit path. The forward path has the same logic function as the C_driver and the feedback circuit is power-gated to operate when the C_driver is power-gated OFF. Thus, the S_keeper provides a latching function of parallel, opposing inverters. The feedback circuitry has an isolation PFET and NFET just like the C_driver with the exception that the NFET is gated with the Cut_P control signal and the PFET is gated with the Cut_N control signal. In this manner, the feedback circuitry is OFF when the power-gated domain (and C_driver) is ON and it is gated ON when the power-gated domain is gated OFF. The S_keeper comprises a normal low leakage inverter in parallel with an opposing feedback inverter that forms a complementary C_driver which uses the control signals Cut_P, and Cut_N to power-gate devices in a manner though opposite that of the normal C_driver.

In other embodiments of the present invention, various levels of power-gating may be employed wherein a C_driver may gate either the positive voltage, the ground voltage, or both voltages. In these three cases, the latch circuitry that preserves the logic state of the C_driver output may be non-power-gated or utilize the same power gating as the corresponding C_driver with which it is used. When the latch is power-gated, its power-gating devices are turned ON when the C_driver power-gating devices are turned OFF and visa-versa.

Embodiments of the present invention may be used to interface a power-gated domain with a non-power-gated domain or may be used to interface non-power-gated domains. Likewise, embodiments of the present invention selectively employ power-gating. When power-gating is selectively employed, the control signals for PFET and NFET switches may not be complementary but may rather be independent such that both devices do not have to be turned ON and OFF at the same time. Other embodiments may use complementary signals for power-gating.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
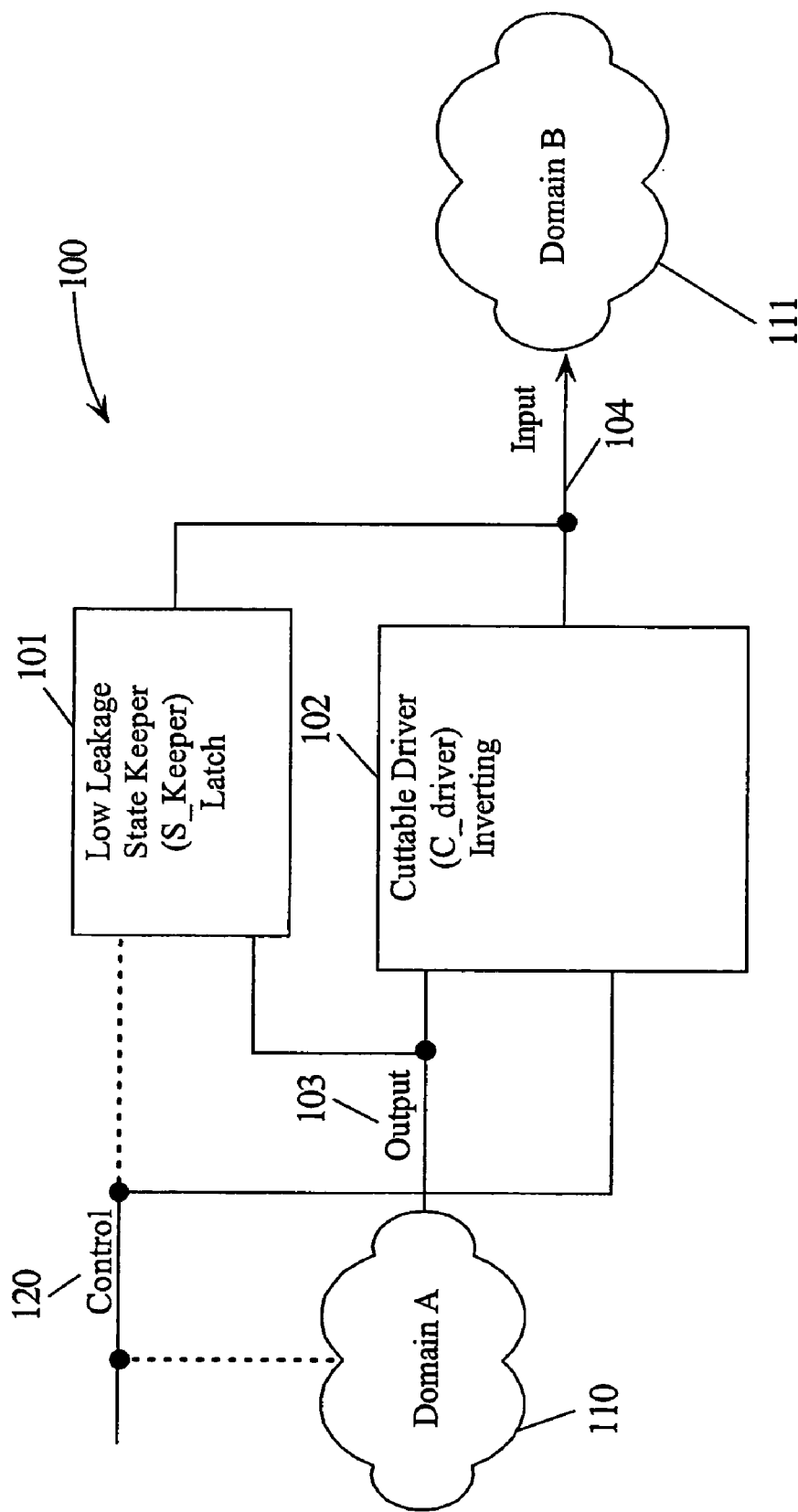
FIG. 1 is a block diagram of the circuit topology according to embodiments of the present invention.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 is a general block diagram illustrating an output signal 103 from a Domain A 110 being coupled to an input 104 to a Domain B 111. Domain A 110 may optionally be a domain employing power-gating herein referred as a "Cuttable" domain. A Cuttable domain (C_Domain) is one which employs circuitry whose power supply voltage may be decoupled to save leakage power. A Non-Cuttable domain (NC_Domain) is one which employs circuitry whose power supply voltage is not decoupled. Control signal 120 is shown dotted as optionally coupling to Domain A 110 and used to control power-gating in Domain 110. Output signal 103 is coupled to a Cuttable driver (C_driver) 102. Control signal 120 is used to gate devices in C_driver 102 and optionally in S_keeper (Latch) 101 to provide power-gating. One logic state of control signal 120 controls the device used to gate the positive power supply voltage and the other logic state of control signal 120 controls the device used to gate the negative power supply voltage to the C_driver 102. When a Domain A 110 providing output 103 is coupled to an Domain B 111, the output 103 is coupled through a C_driver 102 and S_keeper 101. S_keeper 101 is a low leakage power latch circuit that holds the logic state of input 104 when C_driver 102 is power-gated. S_keeper 101 may also have power-gated circuitry that is controlled in response to logic states of control signal 120, thus circuitry in S-keeper 101 is power-gated ON when C_driver 102 is power-gated OFF.

Figure 2A:
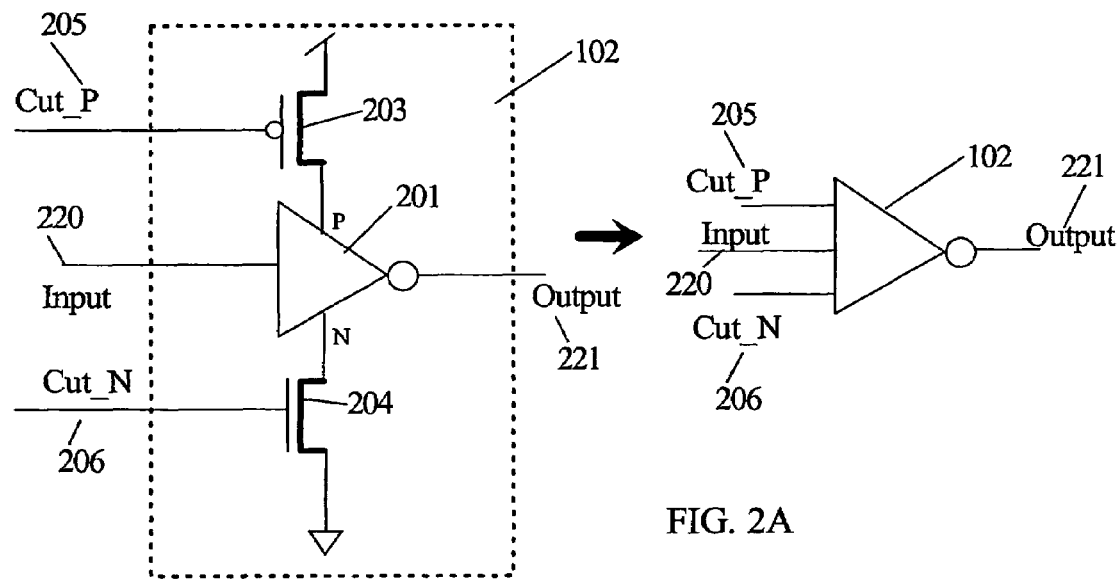
FIGS. 2A and 2B are circuit diagrams illustrating specific circuit configurations and circuit blocks used for the functions in other FIGS.

FIG. 2A is a detailed circuit diagram of a C_driver 102. C_driver 102 comprises an inverting stage 201 with input 220 and output 221. Inverter 201 is power-gated with PFET 203 which couples the positive power supply voltage in response to control signal Cut_P 205. Likewise, NFET 204 is used to gate the negative power supply voltage (ground) in response to control signal Cut_N 206. A compact circuit symbol for C-driver 102 is also shown in FIG. 2A.

Figure 2B:
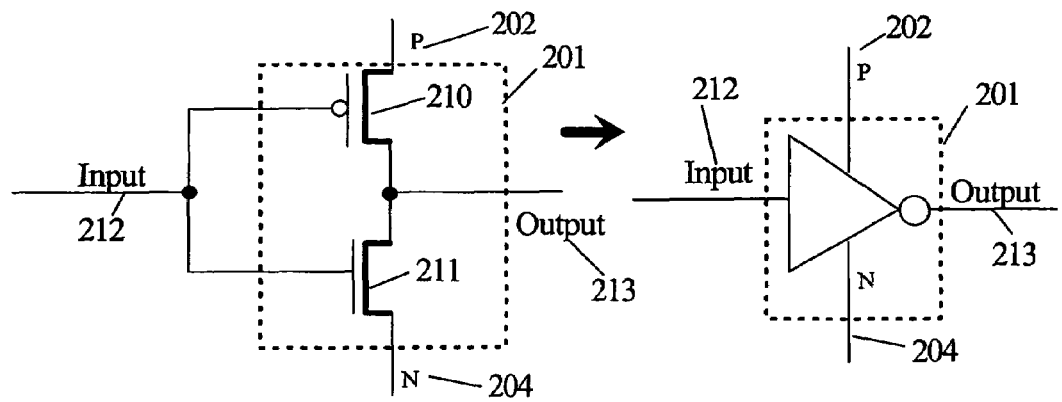

FIG. 2B illustrates standard CMOS inverting stage 201 comprising PFET 210 and NFET 211. Power supply terminals P 202 and N 204 are also shown. In some cases, circuits are configured using inverting stage 201 with P 202 and N 204 coupled directly to their corresponding power supply voltages, and in other cases, power-gating PFET (e.g., PFET 203) and NFET (e.g., NFET 204) devices are used for gating power to inverting stage 201. Also shown in FIG. 2B is a compact circuit symbol for inverter stage 201 used in other circuit diagrams. Inverting stage 201 receives input 212 and generates output 213.

Figure 3A:
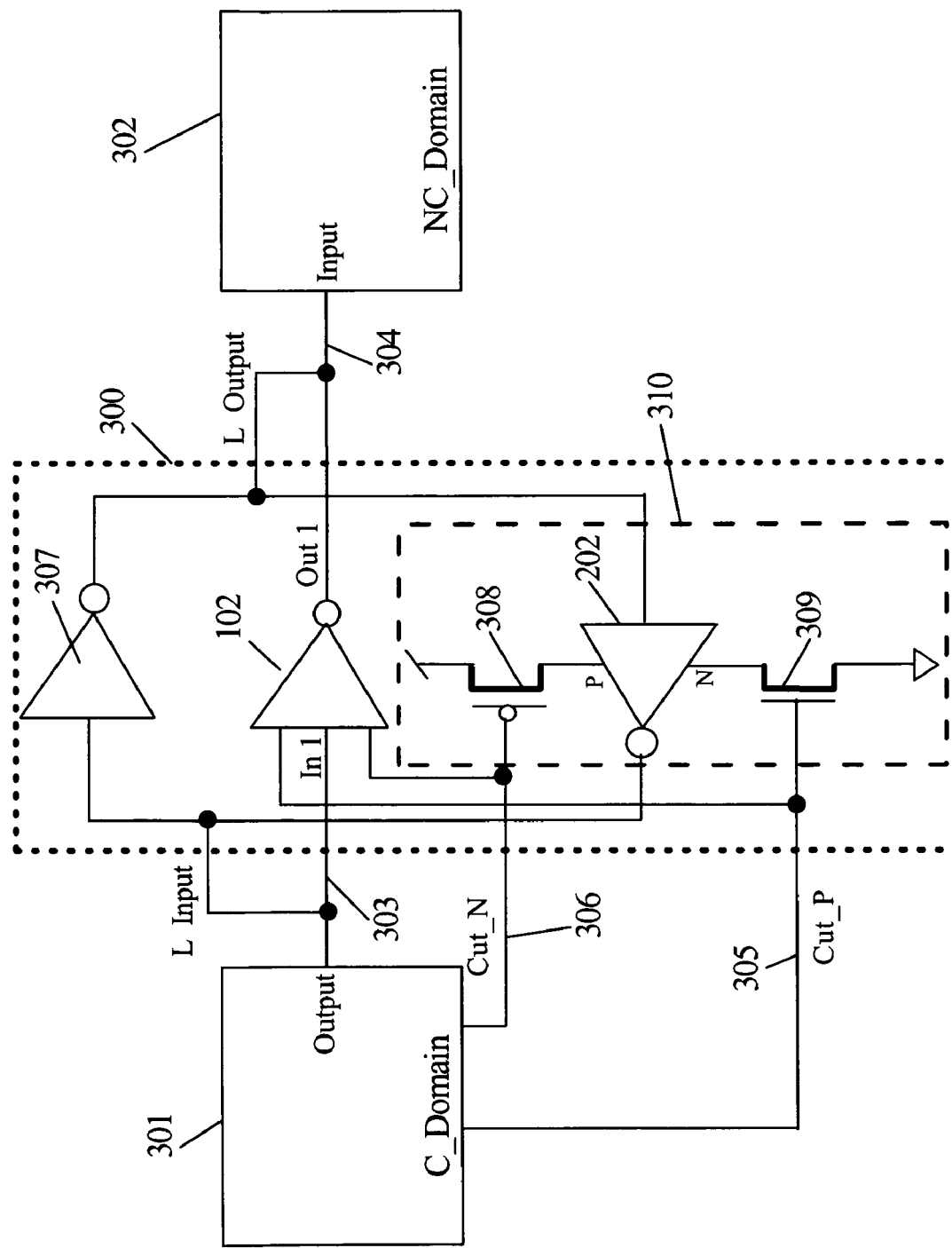
FIG. 3A is a circuit diagram illustrating a Cut Domain and a Non-Cut Domain interfaced with circuitry according to embodiments of the present invention with full power-gating in the C_driver and latch circuitry.

FIG. 3A is a circuit diagram of a C_Domain 301 with output 303 interfaced to a NC_Domain 302 with input 304 using circuitry 300 according to embodiments of the present invention. FIG. 3A illustrates maximum leakage control with power gating in C_Domain 301 and full power-gating in both C_driver 102 and the latch circuitry comprising inverter 307, inverting stage 202, PFET 308, and NFET 309. Control signals Cut_N 306 and Cut_P 305 are shown originating from C_Domain 301. It is understood that these control signals may be generated by other circuits for use in C_Domain 301 and interface circuitry 300. Circuitry 300 receives output 303, control signals Cut_N 306 and Cut_P 305, and generates input 304 to NC_Domain 302. Inverting stage 202 is power-gated with PFET 308 and NFET 309. The input to inverting stage 202 is coupled to input 304 and its output is coupled back to output 303. PFET 308 and NFET 309 are applied complementary to the way they are used to gate the power on C_driver 102. In this manner, when the C_driver 102 in circuitry 300 has its power decoupled, power is applied to inverting stage 202. When inverting stage 202 is power-gated ON, it works with inverter 307 to provide low leakage latching of the logic state of input 304. When the C_driver 102 in circuitry 300 is power-gated OFF, inverting stage 202 is power-gated ON with PFET 308 and NFET 309 in response to control signals Cut_P 305 and Cut_N 306, respectively. These back to back opposing inverters latch the logic state of input 304. Feedback via inverting stage 202 keeps the logic state of output 303 from being indeterminate during the time circuitry in C_Domain 301 is power-gated. The configuration in FIG. 3A provides the best reduction in leakage by power-gating circuitry in C_Domain 301 and power gating both C_driver 102 and the latching stage 310.

While FIG. 3A illustrates interfacing between a C_Domain 301 and a NC_Domain 302, it is possible to use embodiments of the present invention as a means to save power by reducing leakage in drivers coupling a first NC_Domain (not shown) with a NC_Domain 302. Since interface drivers use large devices to drive large loads, power is saved by using a C_driver (e.g., C_driver 102). When a C_driver is power-gated OFF, its output logic state may become indeterminate. Using embodiments of the present invention, the latch circuitry comprising inverter 307 and latching stage 310 hold the logic state at input 304. Therefore, the forward path (C_driver 102 and inverter 307) are active when needed and the feedback path comprising inverter 202, PFET 308 and NFET 309 are enabled when C_driver 102 is power-gated OFF. In FIG. 3, control signals Cut_N 306 and Cut_P305 are shown coming from C_Domain 301, however, these complementary signals would originate from control circuitry managing power if not available as part of power-gating in a C_Domain 301. The C_driver 102 and latch circuitry shown in FIGS. 1, 3A, 4A, and 4B have a common ground potential and common positive potential. However, in general C_driver 102 may have a different positive potential from latch circuitry (e.g., 307 and 310) used to hold states of C_driver 102 when it is power gated. C-driver 102, 722, and 822 and latch circuitry used in embodiments of the present invention may be considered to be powered by power supply voltages with a common low or ground voltage potential and compatible but different positive or high voltage potentials.

Figure 3B:
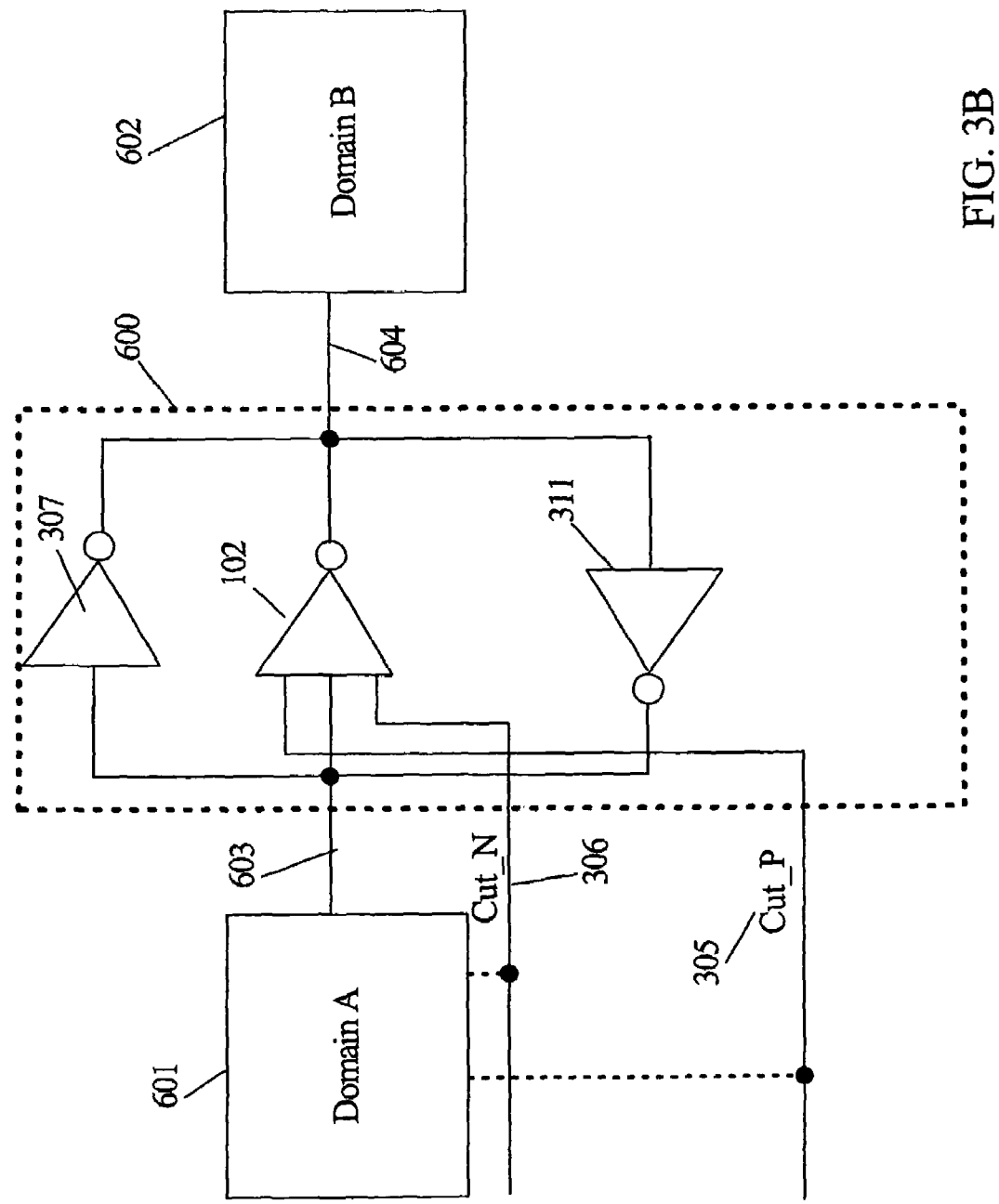
FIG. 3B is a circuit diagram illustrating a Domain A and a Domain B interfaced with circuitry according to embodiments of the present invention with full power-gating in the C_driver and no power-gating in the latch circuitry.

FIG. 3B illustrates circuitry 600 interfacing between Domain A 601 and Domain B 602. Controls signals Cut_N 306 and Cut_P 305 are shown optionally coupled to Domain A 601 in the case it is a C_Domain. FIG. 3B illustrates the case where C_driver 102 is fully power-gated and the latch circuitry (inverters 307 and 311) are not power-gated. This embodiment does not have the leakage current savings as the embodiment in FIG. 3A, however there are fewer devices used. This is a trade-off that may be necessary depending on the application.

Figure 4A:
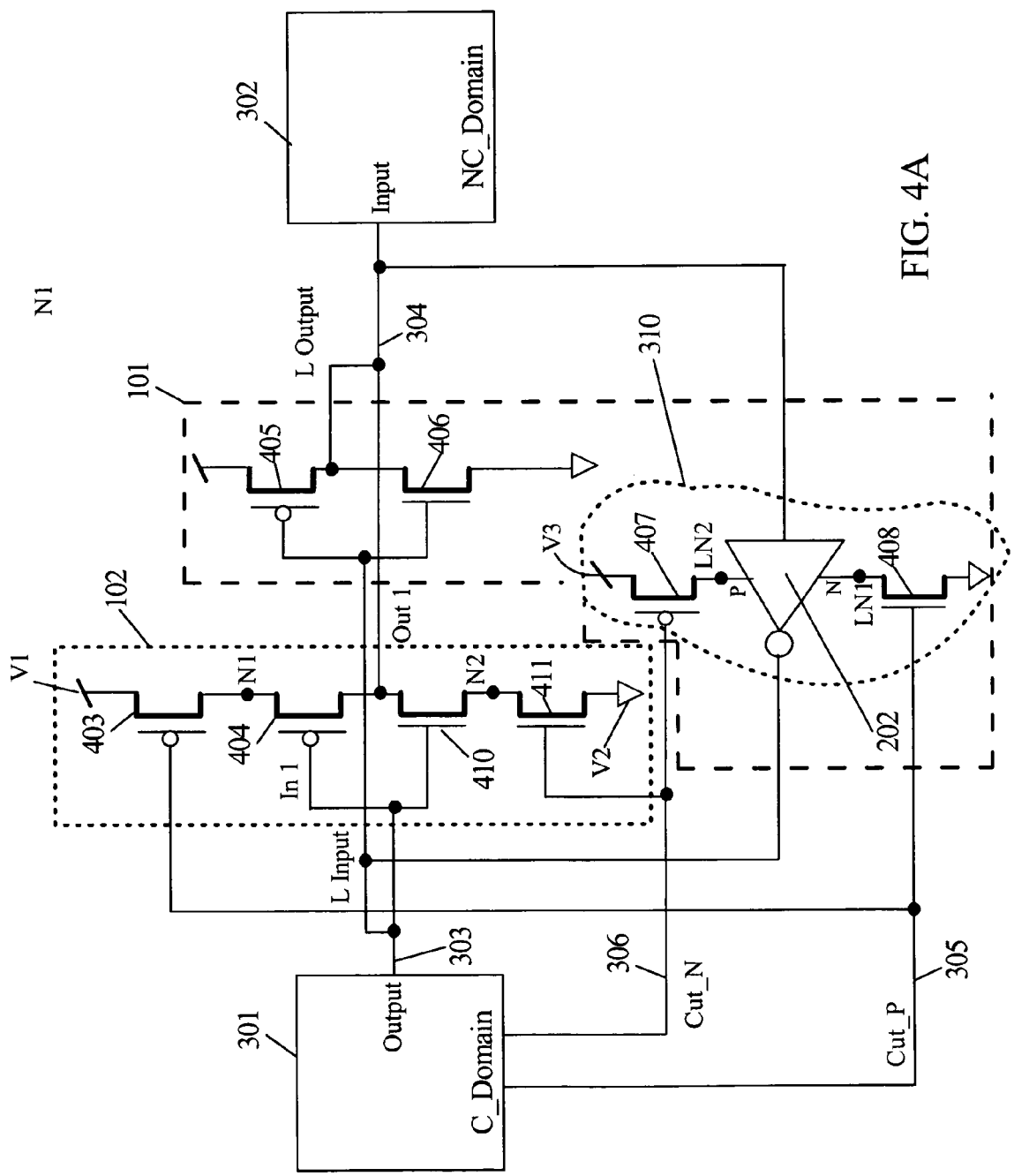
FIG. 4A is a detailed circuit diagram of the circuitry with only positive power supply gating in the C_driver and the latching circuitry.

FIG. 4A is a more detailed circuit diagram of the embodiment in FIG. 3A interfacing an output 303 from C_Domain 301 to input 304 to NC_Domain 302. FIG. 4A uses the overall topology illustrated in FIG. 1 with C_driver 102 block and S_keeper 101 block and shows details of devices that may be used in each block. Control signals Cut_P 105 and Cut_N 106 are used to power gate circuits in C_Domain 301 and are also used in gating circuitry in C_driver 102 and S_keeper 101. C_driver 102 comprises PFET 404 and NFET 410 which form the inverting portion of C_driver 102. Likewise, PFET 403 and NFET 411 gate the power supply voltage to the devices in response to control signals Cut_P105 and Cut_N106, respectively. A standard CMOS inverter is formed by PFET 405 and NFET 406 in S-keeper 101. This CMOS inverter is coupled in parallel with the inverting stage in C_driver 102. Inverting stage 202 in S_keeper 101 is power-gated by PFET 407 and NFET 408 using control signals Cut_N 106 and Cut_P 105 respectively. The circuit methodology in embodiments of the present invention allows the low leakage latching circuitry to automatically hold interface signals between C_Domain circuits and NC_Domain circuits while providing maximum leakage current reduction.

Figure 4B:
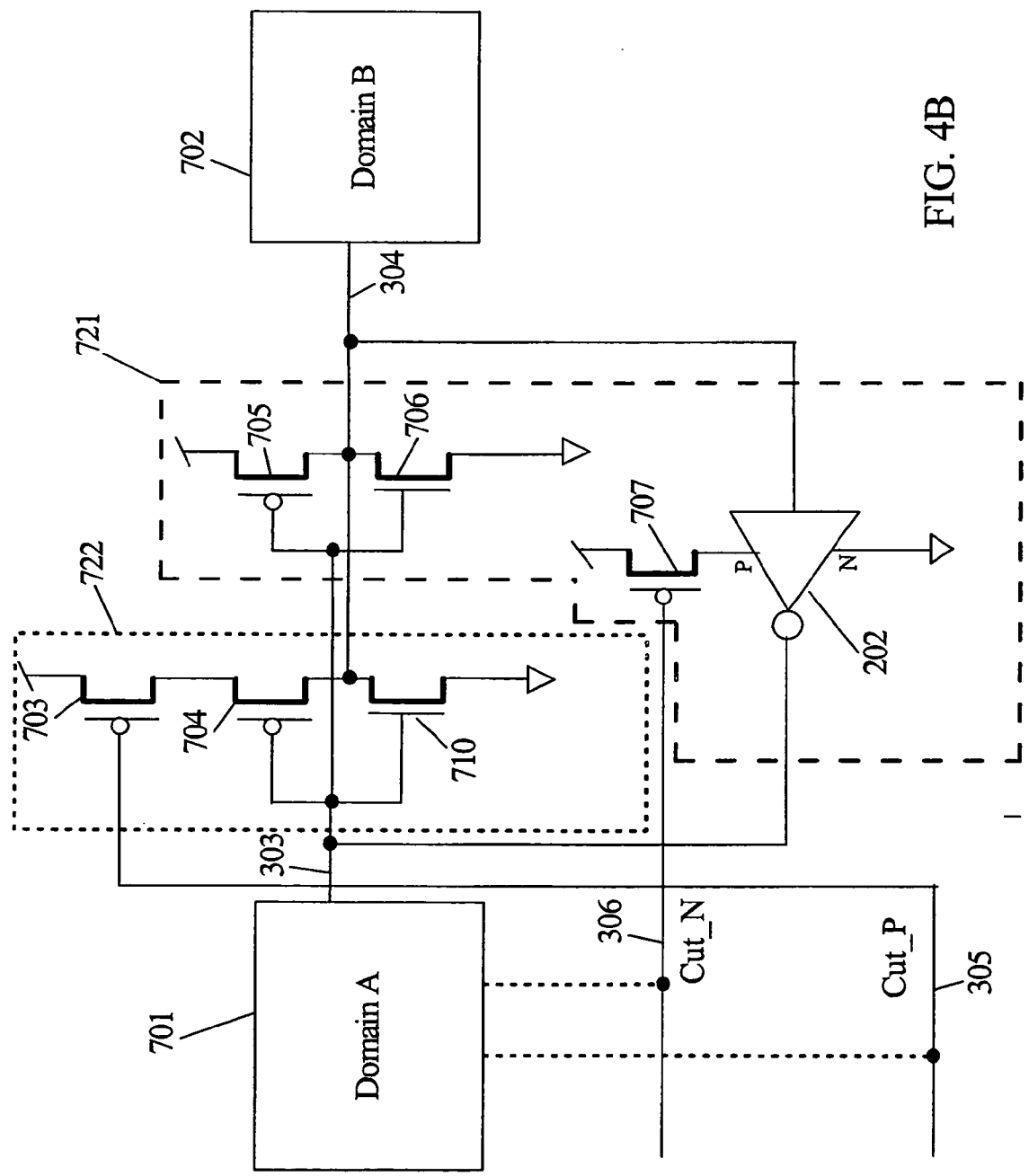
FIG. 4B is a detailed circuit diagram of the circuitry with only negative or ground power supply gating in the C_driver and the latching circuitry.

FIG. 4B is a circuit diagram of another embodiment of the present invention where power gating is realized for only the positive power supply voltage. C_driver 722 comprises inverting stage PFET 704 and NFET 710 and power-gating PFET 703. In this configuration only, the negative power supply terminal of inverting stage 202 in latching circuitry 721 is coupled to ground and the positive power supply terminal is power-gated with PFET 707. PFET 703 and PFET 707 are controlled with complementary signals Cut_N 306 and Cut_P 305. Domain A 701 may be optionally a C-Domain or a NC_Domain. The circuit configuration of FIG. 4B may be used to reduce the leakage in C-driver 722 by turning PFET 703 OFF.

Figure 4C:
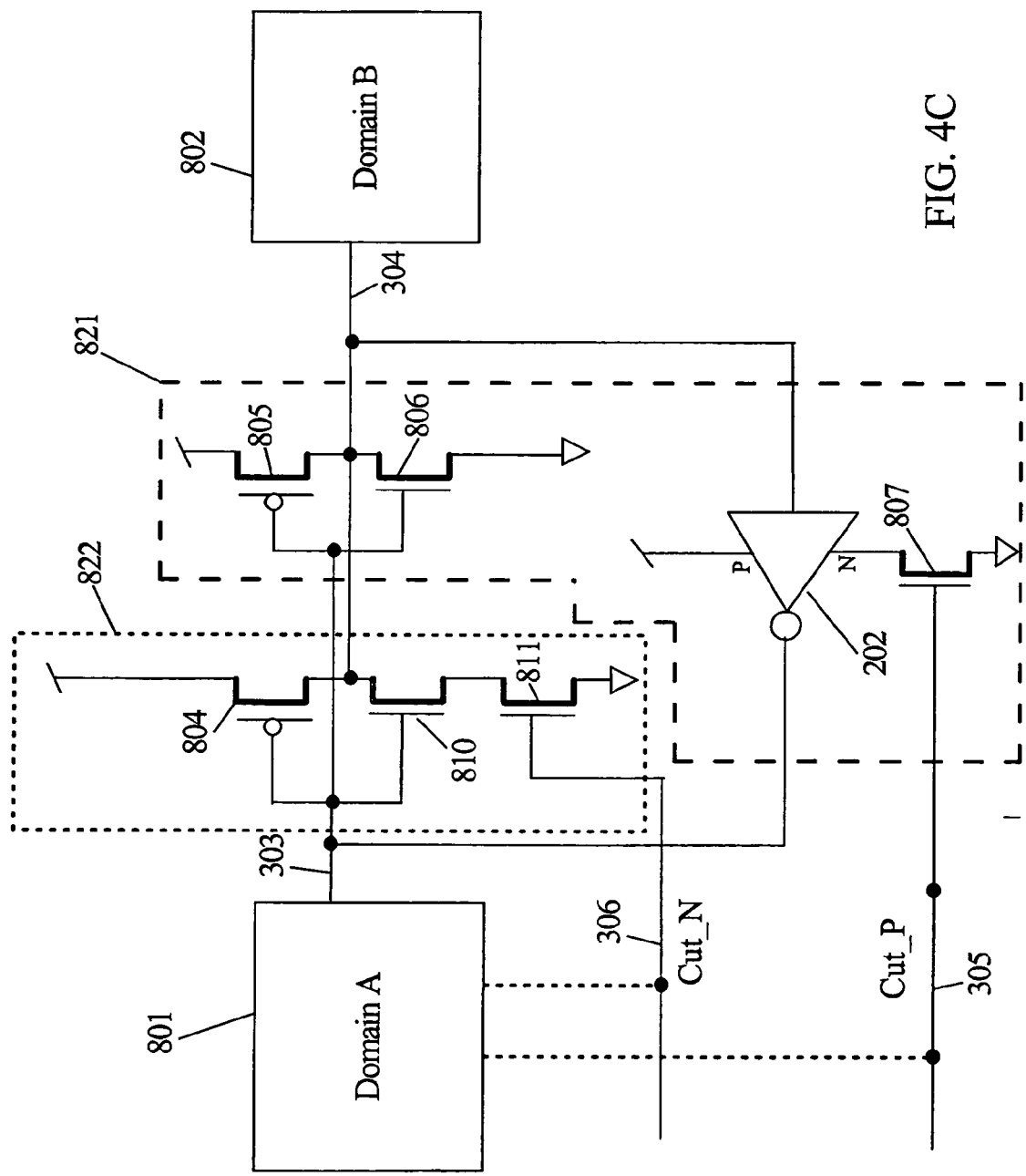
FIG. 4C is a detailed circuit diagram of the circuitry with full power supply gating in the C_driver and the latching circuitry.

FIG. 4C is a circuit diagram of another embodiment of the present invention where power gating is realized for only the negative or ground power supply voltage. C_driver 822 comprises inverting stage PFET 804 and NFET 810 and power gating NFET 811. In this configuration, the positive power supply terminal of inverting stage 202 in latching circuitry 821 is coupled to the positive voltage and the ground power supply terminal is power-gated with NFET 807. NFET 807 and NFET 811 are controlled with complementary signals Cut_N 306 and Cut_P 305. Domain A 801 may be optionally a C-Domain or a NC_Domain. The circuit configuration of FIG. 4C may be used to reduce the leakage in C-driver 822 by turning NFET 811 OFF.

The C_driver 102 and latch circuitry shown in FIGS. 1, 3A, 4A, and 4B are shown powered with a common ground voltage potential and common positive voltage potential. However, in general, C_driver 102 (and other cut_drivers shown) may be powered with a voltage positive potential different from its corresponding latch circuitry (e.g., 307 and 310) used to hold states of C_driver 102 when it is power gated. C-driver 102, 722, and 822 and latch circuitry used in embodiments of the present invention may be considered to be powered by power supply voltages with a common low or ground voltage potential and compatible but different positive or high voltage potentials.

Figure 5:
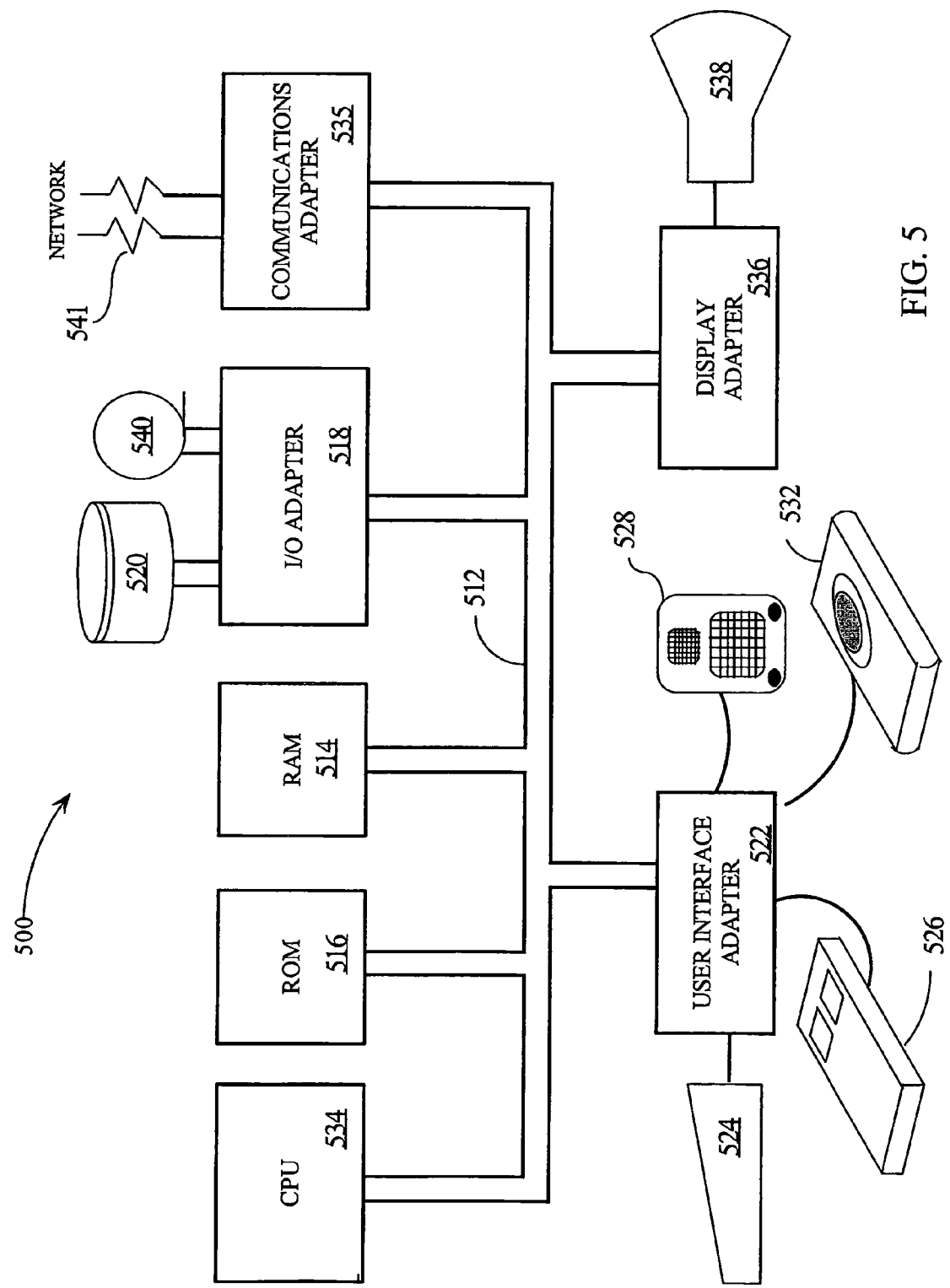
FIG. 5 is a block diagram of a data processing system suitable for practicing embodiments of the present invention.

FIG. 5 is a high level functional block diagram of a representative data processing system 500 suitable for practicing the principles of the present invention. Data processing system 500, includes a central processing system (CPU) 510 operating in conjunction with a system bus 512. System bus 512 operates in accordance with a standard bus protocol, such as the ISA protocol, compatible with CPU 510. CPU 510 operates in conjunction with electronically erasable programmable read-only memory (EEPROM) 516 and random access memory (RAM) 514. Among other things, EEPROM 516 supports storage of the Basic Input Output System (BIOS) data and recovery code. RAM 514 includes, DRAM (Dynamic Random Access Memory) system memory and SRAM (Static Random Access Memory) external cache. I/O Adapter 518 allows for an interconnection between the devices on system bus 512 and external peripherals, such as mass storage devices (e.g., a hard drive, floppy drive or CD/ROM drive), or a printer 540. A peripheral device 520 is, for example, coupled to a peripheral control interface (PCI) bus, and I/O adapter 518 therefore may be a PCI bus bridge. User interface adapter 522 couples various user input devices, such as a keyboard 524 or mouse 526, to the processing devices on bus 512. Display 538 may be, for example, a cathode ray tube (CRT), liquid crystal display (LCD) or similar conventional display units. Display adapter 536 may include, among other things, a conventional display controller and frame buffer memory. Data processing system 500 may be selectively coupled to a computer or telecommunications network 541 through communications adapter 534. Communications adapter 534 may include, for example, a modem for connection to a telecom network and/or hardware and software for connecting to a computer network such as a local area network (LAN) or a wide area network (WAN). CPU 510 and other components of data processing system 500 may contain C_Domain and NC_Domain circuitry interfaced with latching circuitry using circuit methods according to embodiments of the present invention to reduce leakage current.

What is claimed is:

1. An interface logic circuit for coupling a domain output of a first logic circuit domain to a domain input of a second logic circuit domain comprising:

a first cut-circuit powered by first and second voltage potentials and having a first input coupled to the domain output, and a first output coupled to the domain input, wherein the first voltage potential is coupled to the first cut-circuit in response to a first logic state of a first control signal and decoupled from the first cut-circuit in response to a second logic state of the first control signal; and a latch circuit having a latch input coupled to the first input, and a latch output coupled to the first output, wherein the latch circuit latches logic states at the domain input when the first voltage potential is decoupled from the first cut circuit.

2. The interface logic circuit of claim 1, wherein the latch circuit is powered by the second voltage potential and a third voltage potential, and the third potential is coupled to the latch circuit in response to the first logic state of the second control signal and decoupled from the latch circuit in response to the second logic state of the second control signal.

3. The interface logic circuit of claim 2, wherein the second voltage potential is coupled to the first cut-circuit in response to the second logic state of the second control signal and decoupled from the first cut-circuit in response to the first logic state of the second control signal.

4. The interface logic circuit of claim 3, wherein the second voltage potential is coupled to the latch circuit in response to the second logic state of the first control signal and decoupled from the latch circuit in response to the first logic state of the first control signal.

5. The interface circuit of claim 1, wherein the first cut-circuit comprises:

an inverter stage having an inverter input coupled as the input of the first cut_circuit, an inverter output coupled as the output of the first cut_circuit, a first power supply node, and a second power supply node coupled to the second voltage potential; and a first electronic switch coupling the first voltage potential to the first power supply node in response to the first logic state of the first control signal and decoupling the first voltage potential from the first power supply node in response to the second logic state of the first control signal.

6. The interface circuit of claim 5, wherein the latch circuit comprises:

a first inverter having a first inverter input as the latch input and a first inverter output as the latch output; and a second cut-inverter having an input coupled to the latch output, an output coupled to the latch input, wherein the second voltage potential is coupled to the second cut-inverter in response to the second logic state of a first control signal and decoupled from the second cut-inverter in response to the first logic state of the first control signal.

7. The interface circuit of claim 5 further comprising a second electronic switch coupling the second voltage potential to the second power supply node in response to the second logic state of a second control signal and decoupling the second voltage potential from the second power supply node in response to the first logic state of the second control signal.

8. The interface circuit of claim 5, wherein the inverter stage comprises
- an N channel field effect transistor (NFET) having a gate coupled to the inverter input, a source coupled to the second power supply node, and a drain coupled to inverter output; and
- a P channel field effect transistor (PFET) having a gate coupled to the inverter input, a source coupled to the first power supply node, and a drain coupled to the inverter output.

9. The interface circuit of claim 5, wherein the first electronic switch is a PFET having a gate coupled to the first control signal, a drain coupled to the first power supply node, and a source coupled to the first voltage potential.

10. The interface circuit of claim 7, wherein the second electronic switch is an NFET having a gate coupled to the second control signal, a drain coupled to the second power supply node, and a source coupled to the second voltage potential.

11. The interface circuit of claim 6, wherein the second cut-inverter comprises:
- an inverter stage having an inverter input coupled as the input of the second cut_inverter, an inverter output coupled as the output of the second cut_inverter, a first latch power supply node, and a second latch power supply node coupled to the second voltage potential; and
- a third electronic switch coupling the second voltage potential to the first latch power supply node in response to the second logic state of the first control signal and decoupling the second voltage potential from the first latch power supply node in response to first logic state of the first control signal.

12. The interface circuit of claim 11 further comprising a fourth electronic switch coupling the third voltage potential to the second latch power supply node in response to the first logic state of the second control signal and decoupling the third voltage potential from the second latch power supply node in response to the second logic state of the second control signal.

13. The interface circuit of claim 11, wherein the inverter stage comprises:
- an N channel field effect transistor (NFET) having a gate coupled to the inverter input, a source coupled to the second power supply node, and a drain coupled to inverter output; and
- a P channel field effect transistor (PFET) having a gate coupled to the inverter input, a source coupled to the first latch power supply node, and a drain coupled to the inverter output.

14. The interface circuit of claim 11, wherein the third electronic switch is an NFET having a gate coupled to the first control signal, a drain coupled to the first latch power supply node, and a source coupled to the second voltage potential.

15. The interface circuit of claim 12, wherein the fourth electronic switch is an PFET having a gate coupled to the second control signal, a drain coupled to the second latch power supply node, and a source coupled to the third voltage potential.

16. The interface logic circuit of claim 11, wherein the first logic circuit domain is a cut-domain with power-gated circuitry and the second domain is a non-cut-domain without power-gated circuitry.

17. The interface logic circuit of claim 16, wherein a voltage potential is coupled to the power-gated circuitry in the cut-domain in response to the first logic state of the first control signal and decoupled from the power-gated circuitry in response to the second logic state of the first control signal.

18. The interface circuit of claim 1, wherein the latch circuit comprises:
- a first inverter circuit having a first inverter input as the latch input and a first inverter output as the latch output; and
- a second inverter circuit having an second inverter input coupled to the first inverter output and a second inverter output coupled to the second inverter output.

19. The interface circuit of claim 2, wherein the first and third voltage potentials are equal.

20. A data processing system comprising:
- a central processing unit (CPU);
- a random access memory (RAM);
- an input output (I/O) interface unit; and
- a bus for coupling the CPU, RAM and I/O interface unit, the CPU having first and second logic circuit domains and an interface logic circuit for coupling a domain output from the first logic circuit domain to a domain input to the second logic circuit domain, the interface circuit including a first cut-circuit powered by first and second voltage potentials and having a first input coupled to the domain output, and a first output coupled to the domain input, wherein the first voltage potential is coupled to the first cut-circuit in response to a first logic state of a first control signal and decoupled from the first cut-circuit in response to a second logic state of the first control signal, and a latch circuit having a latch input coupled to the first input, and a latch output coupled to the first output, wherein the latch circuit latches logic states at the domain input when the first voltage potential is decoupled from the first cut-circuit.

21. The data processing system of claim 20, wherein the latch circuit is powered by the second voltage potential and a third voltage potential, and the third potential is coupled to the latch circuit in response to the first logic state of the second control signal and decoupled from the latch circuit in response to the second logic state of the second control signal.

22. The data processing system of claim 21, wherein the second voltage potential is coupled to the first cut-circuit in response to the second logic state of the second control signal and decoupled from the first cut-circuit in response to the first logic state of the second control signal.

23. The data processing system of claim 22, wherein the second voltage potential is coupled to the latch circuit in response to the second logic state of the first control signal and decoupled from the latch circuit in response to the first logic state of the first control signal.

24. The data processing system of claim 21, wherein the first and third voltage potentials are equal.

* * * * *

UNITED STATES PATENT AND TRADEMARK OFFICE
CERTIFICATE OF CORRECTION

PATENT NO. : 7,046,063 B2
APPLICATION NO. : 10/821047
DATED : May 16, 2006
INVENTOR(S) : Kuang et al.

It is certified that error appears in the above-identified patent and that said Letters Patent is hereby corrected as shown below:

Claim 2, Column 8, line 30, after "logic state of" delete "the" and insert --a--;

Claim 21, Column 10, line 49, after "logic state of" delete "the" and insert --a--.

Signed and Sealed this

Seventh Day of August, 2007

JON W. DUDAS
*Director of the United States Patent and Trademark Office*